United States Patent
Kusunoki et al.

(10) Patent No.: US 6,303,094 B1
(45) Date of Patent: Oct. 16, 2001

(54) PROCESS FOR PRODUCING CARBON NANOTUBES, PROCESS FOR PRODUCING CARBON NANOTUBE FILM, AND STRUCTURE PROVIDED WITH CARBON NANOTUBE FILM

(75) Inventors: Michiko Kusunoki; Junko Shibata, both of Nagoya (JP)

(73) Assignee: Japan Fine Ceramics Center, Nagoya (JP)

( * ) Notice: Subject to any disclaimer, the term of this patent is extended or adjusted under 35 U.S.C. 154(b) by 0 days.

(21) Appl. No.: 09/194,204
(22) PCT Filed: Mar. 23, 1998
(86) PCT No.: PCT/JP98/01237
  § 371 Date: May 21, 1999
  § 102(e) Date: May 21, 1999
(87) PCT Pub. No.: WO98/42620
  PCT Pub. Date: Oct. 1, 1998

(30) Foreign Application Priority Data

Mar. 21, 1997  (JP) .................................................... 9-087518

(51) Int. Cl.⁷ ....................................................... D01F 9/12
(52) U.S. Cl. .................................... 423/447.1; 423/445 B
(58) Field of Search ........................... 423/445 R, 445 B, 423/447.1; 428/408, 402, 367

(56) References Cited

U.S. PATENT DOCUMENTS 5,626,650 * 5/1997 Rodriguez et al. ..................... 95/116

FOREIGN PATENT DOCUMENTS

| 2-184511 | 7/1990 | (JP) . |
| 6-280116 | 10/1994 | (JP) . |
| 7-61803 | 3/1995 | (JP) . |
| 8-91818 | 4/1996 | (JP) . |
| 9-157022 | 6/1997 | (JP) . |

OTHER PUBLICATIONS

Hirofumi Takikawa et al: "Carbon Nanotubes On SiC Powder Surface Grown By A Vacuum Heating Process" Jpn. J. Appl. Phys. vol. 37 (1998) pp. L187–L189; Part 2, No. 2A, Feb. 1, 1998.

Michiko Kusunoki et al.; "Epitaxial carbon nanotube film self–organized by sublimation decomposition of silicon carbide"; *Applied Physics Letters*; vol. 71, No. 18; Nov. 3, 1997; pp. 2620–2622.

Michiko Kusunoki; "High Temperature Observation of Ceramics—TEM Observation of the Formation Process for Carbon Nanotubes at High Temperature"—; JFCC Review vol. 9; Dec., 1997; pp. 242–247.

* cited by examiner

Primary Examiner—Stuart L. Hendrickson
(74) Attorney, Agent, or Firm—Morgan, Lewis & Bockius LLP

(57) ABSTRACT

The present invention relates to a novel method of manufacturing carbon nanotubes and a method of manufacturing a nanotube film that is composed of a multitude of carbon nanotubes so oriented as to extend along a thickness direction of the film. The present invention further relates to a structure equipped with a carbon nanotube film formed on a surface of a base plate portion. In the method of the present invention, SiC is heated under vacuum to remove silicon atoms from the SiC, whereby the carbon nanotubes are formed at a portion of the SiC where the silicon atoms have been removed. This method makes it possible to manufacture carbon nanotubes with high yields as well as high purity. The carbon nanotubes formed according to this method tend to be oriented perpendicularly to the surface of the SiC crystal. Thus, it is possible to obtain a nanotube film composed of the aforementioned carbon nanotubes with a high degree of orientation. This method facilitates the manufacture of a nanotube film with a large area.

4 Claims, 15 Drawing Sheets 0.1 μm 0.1 μm 20 nm 20 nm 20 nm

PROCESS FOR PRODUCING CARBON NANOTUBES, PROCESS FOR PRODUCING CARBON NANOTUBE FILM, AND STRUCTURE PROVIDED WITH CARBON NANOTUBE FILM

TECHNICAL FIELD

The present invention relates to a method of manufacturing carbon nanotubes and a method of manufacturing a carbon nanotube film that is composed of a multitude of carbon nanotubes well oriented along a thickness direction thereof. The present invention further relates to a structure equipped with a carbon nanotube film formed on a surface of a base plate portion.

BACKGROUND ART

A carbon nanotube is composed of a plurality of cylindrically rolled graphite films that are arranged telescopically. Conventionally, there is generally proposed a method of manufacturing carbon nanotubes, wherein amorphous carbon as a raw material is subjected to arc discharge, laser radiation or the like under the atmosphere of an inactive gas to evaporate carbon and the thus- evaporated carbon is condensed on (recombined with) a carbon red or the like to cause carbon nanotubes to grow thereon.

According to the aforementioned manufacturing method, amorphous carbon, graphite and fullerene are formed on the carbon rod or the like in addition to the carbon nanotubes. Hence, several manufacturing methods have been proposed to increase yields of carbon nanotubes or enhance productivity thereof. For example, Japanese Patent Publication No. 2548511 discloses a method of synthesizing fullerene and carbon nanotubes by means of high-frequency plasma, and Japanese Patent Application Laid-Open No. HEI 6-280116 discloses a method of manufacturing carbon nanotubes wherein arc discharge is carried out within a specific pressure range.

However, according to both the aforementioned methods, carbon nanotubes are formed by condensedly recombining carbon vapor. Thus, to evaporate carbon whose boiling point is extremely high, it is necessary to achieve a high temperature approximate to 3000° C. The manufacture of carbon nanotubes is conducted under such harsh conditions, so that it is difficult to keep the amount of products other than carbon nanotubes below a certain level. The conventional method of causing carbon nanotubes to grow from carbon vapor is also disadvantageous in that carbon nanocapsules tend to be generated and attached to an outer periphery of the carbon nanotubes.

On the other hand, it has been expected to discover a new usage of carbon nanotubes in the fields of electronics, material separation films and the like by obtaining a "carbon nanotube film" that is composed of a multitude of carbon nanotubes well oriented to extend along a thickness direction of the film. However, according to the aforementioned method, it is difficult to control the direction in which the carbon nanotubes grow. In particular, it is virtually impossible to obtain a film that is composed of a multitude of carbon nanotubes well oriented along a certain direction.

It is an object of the present invention to provide a novel method of manufacturing carbon nanotubes.

It is another object of the present invention to provide a method of manufacturing a film that is composed of a multitude of carbon nanotubes well oriented along a certain direction (hereinafter referred to as a "nanotube film").

It is still another object of the present invention to provide a structure equipped with a nanotube film formed on a surface of a base plate portion.

DISCLOSURE OF THE INVENTION

In the case where a silicon carbide (SiC) crystal is heated under vacuum, for example, at a degree of vacuum of about $10^{-7}$ Torr, it has been known that the SiC crystal becomes decomposed and loses silicon atoms when the heating temperature exceeds about 1400° C. In this state, the silicon atoms are sequentially removed from a surface side of the SiC crystal. In other words, the surface of the SiC crystal is first changed into a layer which is devoid of silicon atoms, i.e. a layer solely composed of the remaining carbon atoms (hereinafter referred to as an "Si removed layer"). Then, the thickness of Si removed layer increases in such a manner as to gradually permeate the interior of the original SiC crystal. It has been conventionally considered that the carbon atoms constituting the aforementioned Si removed layer are either in an amorphous state or equivalent to a normal graphite layer.

Entirely unexpectedly, however, the inventors of the present invention have discovered for the first time that the carbon atoms constituting the Si removed layer constitute carbon nanotubes, by observing the Si removed layer using a transmission electron microscope (hereinafter referred to as a "TEM").

Furthermore, the inventors have discovered that a nanotube film that is composed of carbon nanotubes substantially all oriented along a given direction can be obtained by heating a SiC crystal under vacuum.

In other words, a method of manufacturing carbon nanotubes according to an embodiment of the invention is characterized in that silicon atoms are removed from a SiC crystal due to a heating process of the SiC crystal under vacuum.

As long as the silicon atoms can be removed from the SiC crystal, the manufacturing method of the present invention does not require any specific degree of vacuum or heating temperature. For example, the carbon nanotubes can be formed in a vacuum ranging from $10^{-3}$ to $10^{-12}$ Torr. The vacuum ranges preferably from $10^{-4}$ to $10^{-10}$ Torr (more preferably, from $10^{-5}$ to $10^{-9}$ Torr). Furthermore, the heating temperature ranges preferably from 1200 to 2200° C. (more preferably, from 1400 to 2000° C.). If the heating temperature is too high, carbon nanotubes are so formed as to cannibalize each other, resulting in a case where some of the tubes absorb other tubes to further grow. There is also a case where a disorderly arranged graphite phase is formed. These cases are unfavorable because the size of the carbon nanotubes cannot be controlled with ease.

The aforementioned SiC crystal used in manufacturing carbon nanotubes may be any of α-SiC, β-SiC and the mixture thereof. In a stage where silicon atoms are removed due to the heating process carried out under vacuum, the SiC crystal may assume a state of any of α-SiC, β-SiC and the mixture thereof.

According to the manufacturing method of the present invention, as the process of removing silicon atoms proceeds, the Si removed layer gradually spreads out from a surface to a central portion of the SiC crystal and carbon nanotubes are formed thereon. It is also possible to form carbon nanotubes over the entire SiC crystal that is used as a raw material. However, if the Si removed layer becomes too thick, the removal rate of silicon atoms decreases and thus lowers manufacturing efficiency. If the heating temperature or the amount of vacuum is set too high so as to increase the removal rate of silicon atoms, it becomes difficult to control the size of the carbon nanotubes.

The method of manufacturing carbon nanotubes according to an embodiment of the invention makes it possible to obtain carbon nanotubes that are free from adhesion of carbon nanocapsules. As long as the TEM is used to observe the process, the process can be controlled so there is no by-product such as amorphous carbon, graphite or fullerene observed in the Si removed layer. Accordingly, the manufacturing method of the present invention makes it possible to obtain carbon nanotubes with considerably high yields as well as high purity. In addition, as compared to the conventional methods, the manufacturing method of the present invention allows the manufacture of carbon nanotubes at a lower temperature and is therefore advantageous in terms of energy efficiency. Furthermore, it has been revealed from results obtained from EDS (energy dispersive x-ray spectroscopy) and EELS (electron energy loss spectroscopy) analysis that carbon nanotubes with very high purity are formed.

The thus-obtained carbon nanotubes can be used for a variety of purposes, as is the case with those obtained according to the conventional methods. For example, the carbon nanotubes are used as adsorbents, strong structural materials or the like. The carbon nanotubes can be subjected to further processings. For example, it is possible to provide respective tips of the carbon nanotubes with openings and subsequently introduce a substance other than carbon to the carbon nanotubes from the openings thereof, or to introduce functional groups into the carbon nanotubes. The thus-processed carbon nanotubes can be used for quantum fine lines and the like.

It is to be noted herein that Japanese Patent Application Laid- Open No. HEI 6-227806 and the like disclose a method of opening respective tips of carbon nanotubes and that Japanese Patent Application Laid-Open No. HEI 8-12310 and the like disclose a method of introducing functional groups to carbon nanotubes.

An essential advantage of the manufacturing method of the present invention consists in the capability to manufacture a "nanotube film".

That is, the manufacturing method according to an embodiment of the invention relates to a method of manufacturing a carbon nanotube film that is composed of a multitude of carbon nanotubes so oriented as to extend substantially parallel to the thickness direction of the film and is characterized in that silicon atoms are removed from a SiC crystal due to a heating process of the SiC crystal under vacuum.

For example, the aforementioned manufacturing method makes it possible to obtain a well oriented nanotube film wherein 50% or more (more preferably, 70% or more) of the carbon nanotubes constituting the nanotube film extend along such a direction as to form 45° or less (more preferably, 30° or less; and still more preferably, 15° or less) with a thickness direction of the nanotube film. Accordingly, the length of the carbon nonotubes in a well oriented film is substantially equal to the thickness of the film.

The vacuum used in removing silicon atoms from the SiC crystal preferably ranges from $10^{-5}$ to $10^{-9}$ Torr (more preferably, from $10^{-6}$ to $10^{-8}$ Torr). The heating temperature used in removing silicon atoms from the SiC crystal preferably ranges from 1400 to 2000° C. If the heating temperature or the amount of vacuum exceeds the predetermined range, silicon atoms are removed from the SiC crystal at a high rate. In this situation the orientation of the carbon nanotubes constituting the nanotube film tends to become disorderly. If the heating temperature is too high, carbon nanotubes cannibalize each other, resulting in a case where some of the tubes absorb other tubes to grow further. There is also a case where a continuous growth of the disorderly graphite phase prevents carbon nanotubes from being formed. Consequently, the orientation and size homogeneity of the carbon nanotubes may be adversely affected or it becomes difficult to control the size of the tubes. Therefore, the heating temperature should not be too high.

The manufacturing method of the present invention makes it possible to form a nanotube film on all the planes of the SiC crystal, which is used as a raw material. In a nanotube film formed on each plane of the SIC crystal, the carbon nanotubes constituting the nanotube film tend to be oriented perpendicularly to that plane. To obtain a well-oriented nanotube film, the (0001) plane is suitable in the case of α-SiC and the (111) plane is suitable in the case of β-SiC. It is possible to form on these planes a carbon nanotube film with a high degree of orientation along the directions [0001] and [111] respectively.

However, the relationship between the crystal plane and the orientation of carbon nanotubes is unclear in the central portion of a SiC crystal particle, so that the orientation of carbon nanotubes is adversely affected. Thus, with a view to obtaining a well-oriented nanotube film, it is preferable to generate the nanotube film in the vicinity of the surface of the SiC crystal. For example, in the case where the SiC crystal is β-SiC in the shape of a cube having a side of 2.0 μm, the easy obtainment of a well-oriented nanotube film requires that the film have a thickness smaller than 0.5 μm. However, this does not apply to the case where silicon atoms are essentially removed from one side of the crystal, e.g. the case where a SiC crystal in the shape of a flat plate is formed on a substrate impervious to Si gas. By heating the carbon nanotubes for a long period of time at a low temperature, for example, at 1500° C., it is also possible to increase the length of the carbon nanotubes and thus the thickness of the nanotube film.

It will now be described with reference to FIG. 1 how a nanotube film is formed on the (111) plane of β-SiC according to the manufacturing method of the present invention.

If β-SiC is heated to 1400° C. using laser beam radiation means or the like, for example, at a vacuum of $10^{-7}$ Torr as shown in FIG. 1(a), Si escapes from the SiC particle and enters a gas phase as shown in FIG. 1(b), whereby a silicon (Si) removed layer is formed in the vicinity of a surface of the SiC particle. In this state, as shown in FIG. 1(c), carbon nanotubes with a high degree of orientation along the direction [111] are densely formed on the Si removed layer.

According to the method of manufacturing a nanotube film according to the invention, a nanotube film that is composed of a multitude of carbon nanotubes oriented in a direction substantially parallel to a thickness direction of the film can be obtained. For example, since this nanotube film exhibits a certain level of conductivity in the thickness direction thereof but little conductivity in a face direction thereof, it can be used as a device requiring these characteristics. In addition, since the nanotube film exhibits a high degree of homogeneity, it is also useful as a new device, a device utilizing quantum effects or the like. Besides, the nanotube film is also applicable to field emmites, a flat-panel display and the like.

Furthermore, if the tips of the respective tubes constituting the nanotube film are provided with openings, a "nanopipe film" with a multitude of minute passages extending along the thickness direction of the film is formed. This nanopipe film is capable of functioning as a high-quality material separation film. In this type of material separation film, it is preferable that the aforementioned passages be arranged as neatly as possible so as to reduce the resistance resulting from material flow. The manufacturing method of the present invention makes it possible to obtain a nanotube film with a high degree of orientation. Therefore, the nanopipe film with a high degree of orientation, which is made from the nanotube film, is suited for use as a material separation film. In addition, functional groups may be introduced to the nanopipe film, whereby it is possible, for example, to adjust characteristics of material separation.

Furthermore, the method according to the present invention makes it possible to obtain a nanotube film that is composed of densely arranged carbon nanotubes with a high degree of orientation. Thus, it is possible to obtain a carbon material suited for a negative pole of a lithium-ion battery by providing the carbon nanotubes of the nanotube film with openings. In the lithium-ion battery, a carbon-based material such as graphite is employed for the negative pole, so that lithium ions can move among layers (gaps formed among carbon molecules). The material of the present invention is obtained by providing the carbon nanotubes of the nanotube film with openings. This material exhibits a large specific surface area because the carbon nanotubes are densely arranged, and facilitates migration of lithium ions because the material is composed of a multitude of minute straight pipes with a high degree of orientation.

Furthermore, the manufacturing method of the invention makes it possible to obtain a nanotube film with a larger area in comparison with a conventional one. The manufacturing method according to an embodiment of the invention is an example of such a method which enables the manufacture of a nanotube film with a large area. This method is characterized in that a SiC single crystal film is formed on a surface of a substrate and the SiC single crystal film is then heated under vacuum to remove silicon atoms therefrom and in that the carbon nanotube film that is composed of a plurality of carbon nanotubes so oriented as to extend substantially parallel to a thickness direction of the SiC single crystal film is formed over at least a partial thickness portion of a surface side of the SiC single crystal film.

For example, a material such as a SiC single crystal, a carbon substrate or the like can be used as the aforementioned "substrate".

In the case where a carbon substrate is used, for example, Si is implanted into a surface of the carbon substrate so as to form a SiC phase thereon. The SiC phase is then heated under vacuum to generate carbon nanotubes from the SiC phase, whereby a nanotube film can be obtained.

In the case where a Si single crystal is used as the substrate so as to manufacture a nanotube film, for example, the following method is suited to be carried out. That is, a SiC single crystal film is formed on a substrate composed of Si (111) single crystals by means of a chemical vapor deposition method (hereinafter referred to as a "CVD method"). The surface side (i.e. the side opposite to the substrate) of the thus-obtained SiC single crystal film corresponds to a (111) plane. Then, the aforementioned substrate, which is more susceptible to oxidation than the SiC single crystal film, is partially or entirely removed as $SiO_2$ by means of a heating process carried out under vacuum. Thereafter, the remaining SiC single crystal film is further heated, whereby silicon atoms inside the SiC single crystal film are removed from the side of the (111) plane. Consequently, a nanotube film that is composed of carbon nanotubes well oriented along the direction [111] is obtained over at least a partial thickness portion of the surface side of the SiC single crystal film. It is also possible to form carbon nanotubes extending along the direction [111] over the entire thickness of the SiC single crystal film, i.e. from the surface side to the substrate side.

It is already known to form a SiC single crystal film on a substrate by means of the CVD method. The art for forming a SiC single crystal film with a relatively large area by means of the CVD method is also known. Furthermore, the conventional art wherein carbon nanotubes are caused to grow by means of condensation of carbon vapor requires a high temperature approximate to 3000° C. and thus employs heating means such as arc discharge, laser or the like. In this conventional art, it is difficult to perform a heating process homogeneously over a large area. However, the manufacturing method of the present invention does not necessitate a heating temperature higher than 2000° C. and thus employs a normal heating furnace such as an electric furnace, an image furnace (a heating process based on condensation of far-infrared rays) or the like. Therefore, the present invention makes it possible to heat the entire SiC single crystal film with a large area relatively homogeneously. Accordingly, the manufacturing method of the present invention is quite useful in manufacturing a nanotube film with a large area, which was conventionally difficult to manufacture. To function as a material separation film suited for practical use, the nanotube film is required to have an area equal to or larger than 3 $cm^2$. Preferably, it is required to have an area equal to or larger than 5 $cm^2$. Consequently, the manufacturing method of the present invention, which allows enlargement of the area of the nanotube film, is suited to manufacture a nanotube film used as a material separation film.

The method of manufacturing a nanotube film according to an embodiment of the invention is characterized in that a SiC substrate is heated under vacuum to remove silicon atoms from the SiC substrate and in that the carbon nanotube film that is composed of a plurality of carbon nanotubes so oriented as to extend substantially parallel to a thickness direction of the SiC substrate is formed over at least a partial thickness portion of a surface side of the SiC substrate.

Both a single crystal and a polycrystal can be employed as the aforementioned SiC substrate. However, if a film with a high degree of orientation is to be formed over a relatively large area, it is preferable to use the single crystal. The SiC substrate may be any of α-SiC, β-SiC and the mixture thereof. In a stage where silicon atoms are removed due to the heating process carried out under vacuum, the SiC crystal may assume a state of any of α-SiC, β-SiC and the mixture thereof. Although the aforementioned SiC substrate is not limited to any specific shape, it is usual to use a substrate in the shape of a flat plate.

In the present invention, it is not completely clear why carbon nanotubes can be efficiently manufactured under easier conditions as compared to the conventional methods and why a nanotube film composed of well-oriented carbon nanotubes is obtained. However, it is inferred that unlike the case where carbon nanotubes are caused to grow from carbon vapor, the graphite constituting carbon nanotubes would grow epitaxially in the SiC crystal.

The aforementioned inference is based on the fact that the orientation of the SiC crystal is likely to affect the degree of orientation. It is considered that carbon nanotubes are generated while inheriting the crystal structure of SiC to a certain extent.

An embodiment of the invention includes a structure equipped with a carbon nanotube film, including a base plate portion and the carbon nanotube film that is composed of a multitude of carbon nanotubes formed on a surface of the base plate portion and oriented so as to extend substantialy parallel to a thickness direction. The carbon nanotube film is formed by heating under vacuum a substrate having at least a surface layer composed of a SiC crystal to remove silicon atoms from the SiC crystal.

It is to be indicated herein that the "substrate having at least a surface layer composed of a SiC crystal" may be either a substrate having a SiC crystalline layer on a foundation layer or a substrate entirely composed of SiC crystal. In "removing silicon atoms from the SiC crystal" to form a nanotube film, the silicon atoms may be removed either from a partial thickness portion of the surface side of the SiC crystal (i.e. a nanotube film is formed from a partial thickness portion of the surface side of the SiC crystal) or from the entire thickness of the SiC crystal (i.e. a nanotube film is formed over the entire thickness of the SiC crystal).

The aforementioned nanotube film may be formed on only one surface of the aforementioned base plate portion, on both the surfaces thereof, or on at least one surface and a lateral end (i.e. thickness portion) thereof. In addition, a nanotube film may be formed either over a certain area on the surface of the base plate portion or on the entire surface thereof. To form a nanotube film over a certain area of the surface of the base plate portion, there is employed a method wherein the substrate is heated in a vacuum while a material impervious to Si gas is deposited on a predetermined portion of the surface of the SiC crystal. By making use of the fact that the capacity to generate carbon nanotubes differs depending on the crystal orientation of SiC, the surface of the SiC crystal may be partially cut out, for example, into the shape of V so as to change the crystal orientation on the surface (i.e. both a plane with a high capacity to generate carbon nanotubes and a plane with a low capacity to generate carbon nanotubes may be provided). In this manner, it is possible to form a nanotube film over a certain area of the base plate portion. However, it is usually preferred that a nanotube film is formed on one surface of the base plate portion over the entire area thereof, from a partial thickness portion of the surface side of the SiC crystal.

FIG. 11(a) is a model view showing a structure 1a with a nanotube film 13a. Referring to FIG. 11(a), the nanotube film 13a is formed on one surface of a base plate portion 12a composed of SiC over the entire area thereof, from a partial thickness portion of a surface side of the SiC crystal. FIG. 11(b) is a model view showing a structure 1b with a nanotube 13b. Referring to FIG. 11(b), a substrate with a SiC crystalline layer on a foundation layer 14b composed of Si is used, and the nanotube film 13b is formed from a partial thickness portion of a surface side of the SiC crystal. In the structure 1b, the base plate portion 12b is composed of those portions of a SiC crystal 11b where the nanotube film is not to be formed and the foundation 14b. FIG. 11(c) is a model view showing a structure 1c with a nanotube film 13c. Referring to FIG. 11(c), the nanotube film 13c is formed on one surface of a base plate portion 12c composed of SiC, over a certain area thereof as well as over a partial thickness portion thereof.

In this structure, a nanotube film manufactured according to the methods of this invention is provided on the surface of the base plate portion. Therefore, this structure is applicable to a device utilizing quantum effects, an emitter of a transistor, a flat-panel display, a negative pole of a lithium-ion battery and the like.

In the aforementioned structure, the base plate portion is not limited to any specific thickness. The nanotube film is also not limited to any specific thickness. However, if the structure is used for the aforementioned purposes, the thickness of the nanotube film (i.e. the length of the carbon nanotubes) ranges preferably from 0.01 to 50 $\mu$m, more preferably from 0.05 to 20 $\mu$m, and still more preferably from 0.1 to 10 $\mu$m. Furthermore, it is preferable that 50% or more (more preferably, 70% or more) of the carbon nanotubes constituting the nanotube film extend along such a direction as to form 45° or less (more preferably, 30° or less; and still more preferably, 15° or less) with a thickness direction of the nanotube film. In addition, the continuously formed nanotube film preferably has an area equal to or larger than 3 cm$^2$. More preferably, it has an area equal to or larger than 5 cm$^2$.

As described hitherto, the method of manufacturing carbon nanotubes according to the present invention makes it possible to obtain carbon nanotubes with high yields as well as high purity, by using a method completely different from conventional ones, that is, a method of removing silicon atoms from SiC. The method of manufacturing a nanotube film according to the present invention makes it possible to easily manufacture a nanotube film, which was conventionally difficult to manufacture. If this method is used, it is also possible to obtain a nanotube film with a large area. Accordingly, the methods of manufacturing carbon nanotubes and a nanotube film according to the present invention are highly useful in the fields of electronics, material separation films and the like.

In the structure equipped with a nanotube film according to the present invention, the nanotube film is provided on the surface of the base plate portion. Thus, this structure is highly useful in the fields of electronics, gas separation films and the like.

BEST MODES FOR CARRYING OUT THE INVENTION

The present invention will be described hereinafter in further detail based on examples thereof.

EXAMPLE 1

The present example 1 is an example in which a YAG laser beam is used as heating means.

A SiC sintered compact that has been lightly sintered under the condition of 1650° C.×30 min. was cut into a length of 3 mm, a width of 5 mm and a thickness of 0.1 mm so as to be used as a sample. This SiC sintered compact essentially consists of β-SiC and is partially in the process of a transition to α-SiC.

The aforementioned sample was heated and observed using a TEM that is equipped with a sample heating device (manufactured by Nippon Electronics Inc., named "JEOL-4000FX", and having an accelerating voltage of 400 kV). By using optical fibers, the aforementioned sample heating device transmits a continuously oscillated YAG laser beam to an electron microscope and condenses the YAG laser beam onto the sample, thereby heating the sample within the electron microscope. A substantially central portion of the aforementioned sample was irradiated with the YAG laser beam in an area of φ0.2~0.3 mm.

The temperature of the sample was measured in a non-contacting state by utilizing a fiber optical system to introduce the radiation energy emitted from the heated sample into a detector.

Figure 1A:
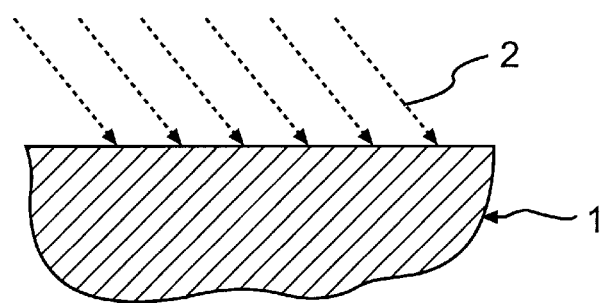
FIGS. 1(a) through 1(c) are model views showing how a nanotube film is generated according to a method of the present invention.
Figure 1B:
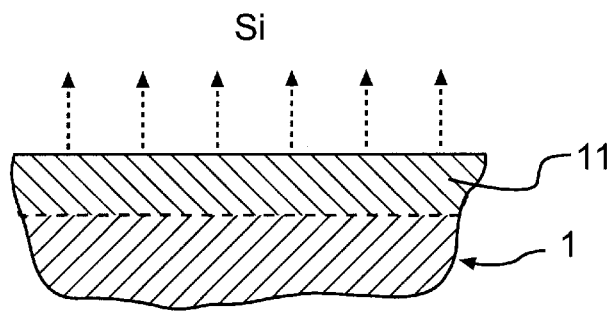
Figure 1C:
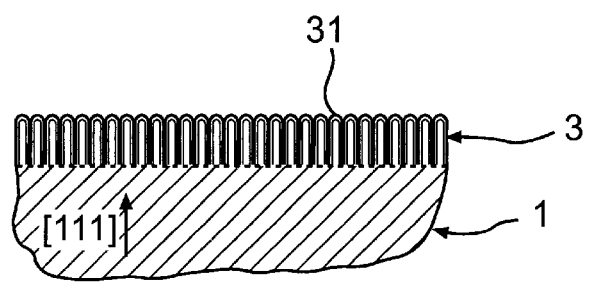
Figure 2:
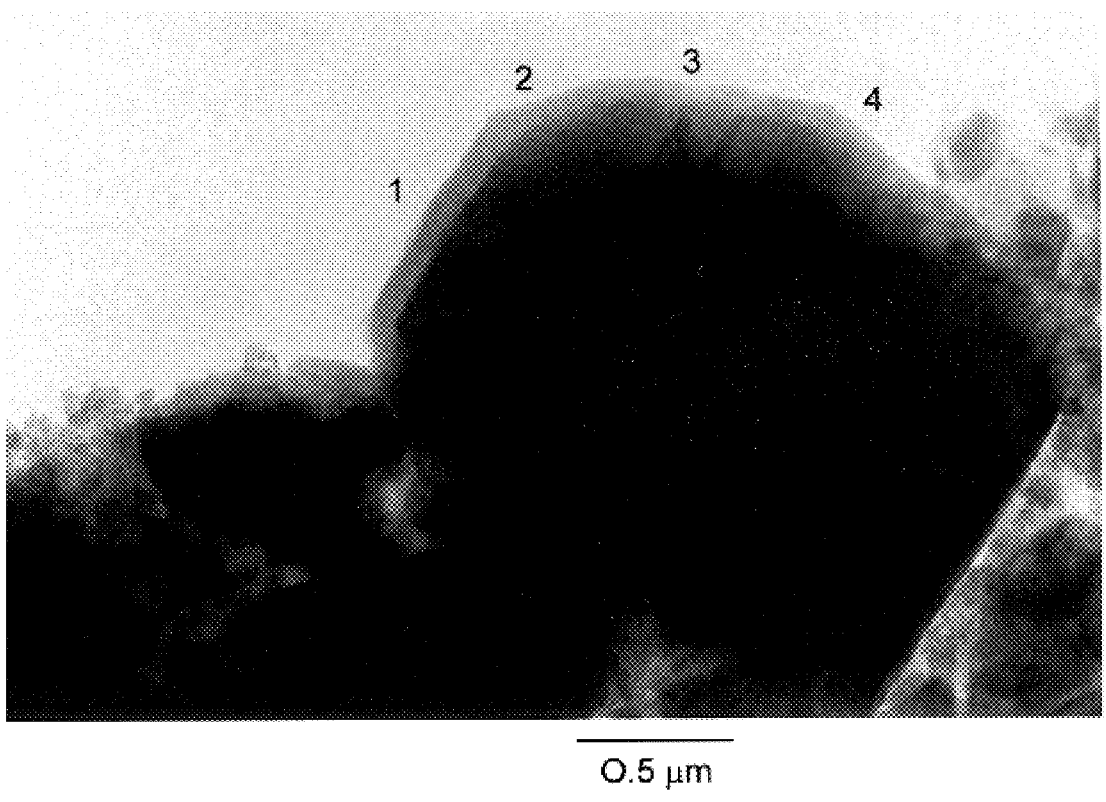
FIG. 2 is a TEM photograph showing the crystal structure of a SiC particle having the nanotube film manufactured according to Example 1.

FIG. 2 shows a β-SiC particle that was observed at a location slightly distant from the center of an irradiation range of the laser beam when the sample was heated to 1400° C. at a vacuum of $10^{-7}$ Torr and a heat-up rate of 80° C./sec. and maintained at the temperature for three minutes. It is observed that a SiC removed layer has a thickness of approximately 0.1 μm in the vicinity of the surface of the particle. It has been confirmed through EDS, observation of an EF-TEM (energy filtering transmission electron microscope), EELS and a result of an electron diffraction figure that the SiC removed layer is subjected to carbonization due to removal of silicon atoms. It is to be noted herein that numerals 1 through 4 in FIG. 2 denote respective planes of the aforementioned particle. The plane 1 corresponds to a plane (111) of β-SiC.

Figure 3:
FIG. 3 is a TEM photograph showing the crystal structure in the vicinity of a surface of the nanotube film shown in FIG. 2.

FIG. 2 reveals that the SiC removed layer has a fiber-like structure with fibers extending substantially parallel to the thickness direction of the layer. FIG. 3 shows a part of a surface portion of the plane 1 shown in FIG. 2, which surface portion is observed with a high resolution. It is observed that the aforementioned "fiber-like structure" is composed of carbon nanotubes that are densely oriented and extending in a direction substantially parallel to the thickness direction of the layer.

Figure 4:
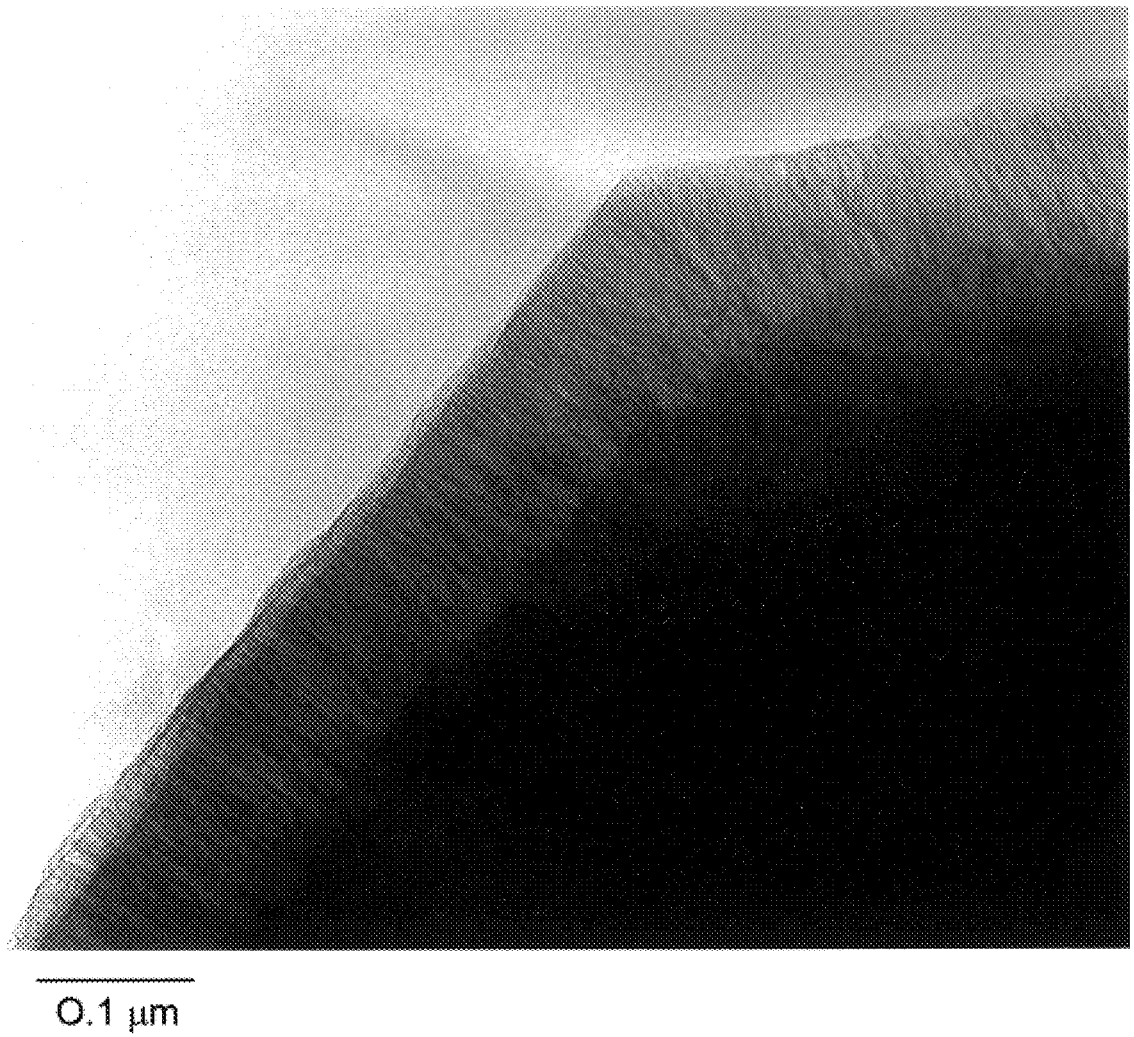
FIG. 4 is a TEM photograph showing the nanotube film formed on the plane 1 of the SiC particle shown in FIG. 2.
Figure 5:
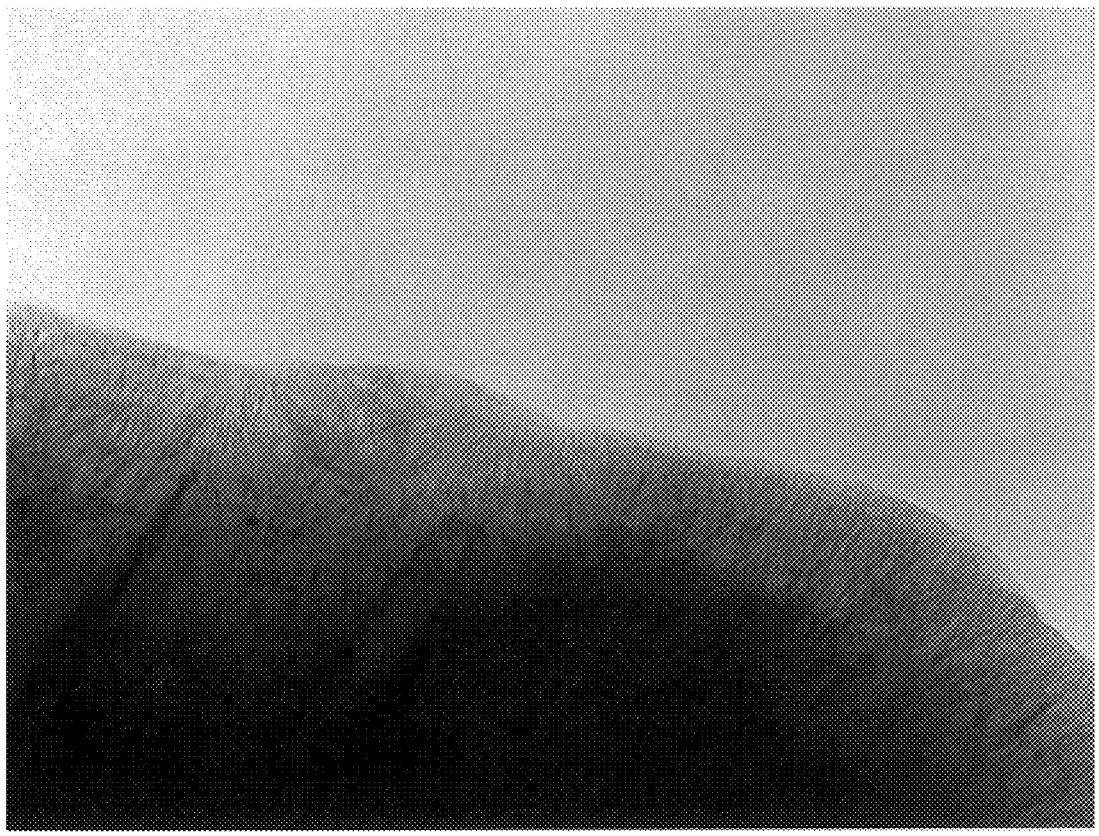
FIG. 5 is a TEM photograph showing the nanotube film formed on the plane 2 of the SiC particle shown in FIG. 2.
Figure 6:
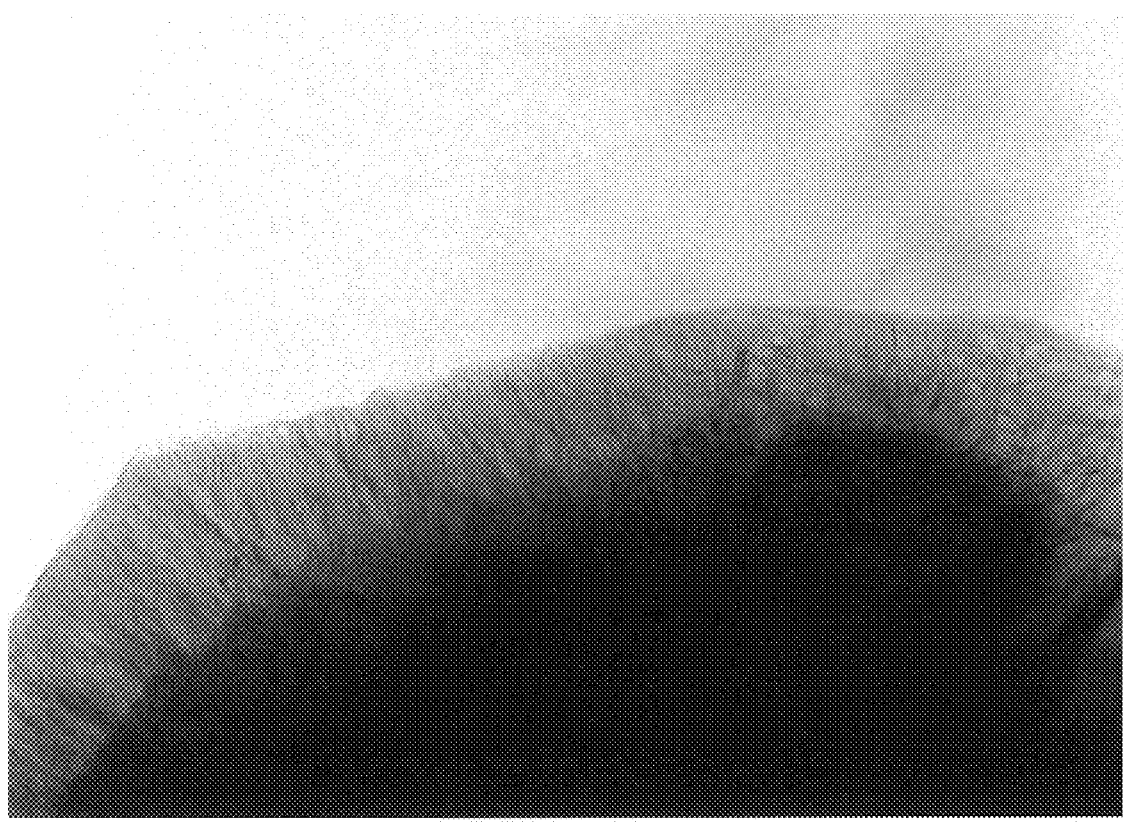
FIG. 6 is a TEM photograph showing the nanotube film formed on the plane 3 of the SiC particle shown in FIG. 2.
Figure 7:
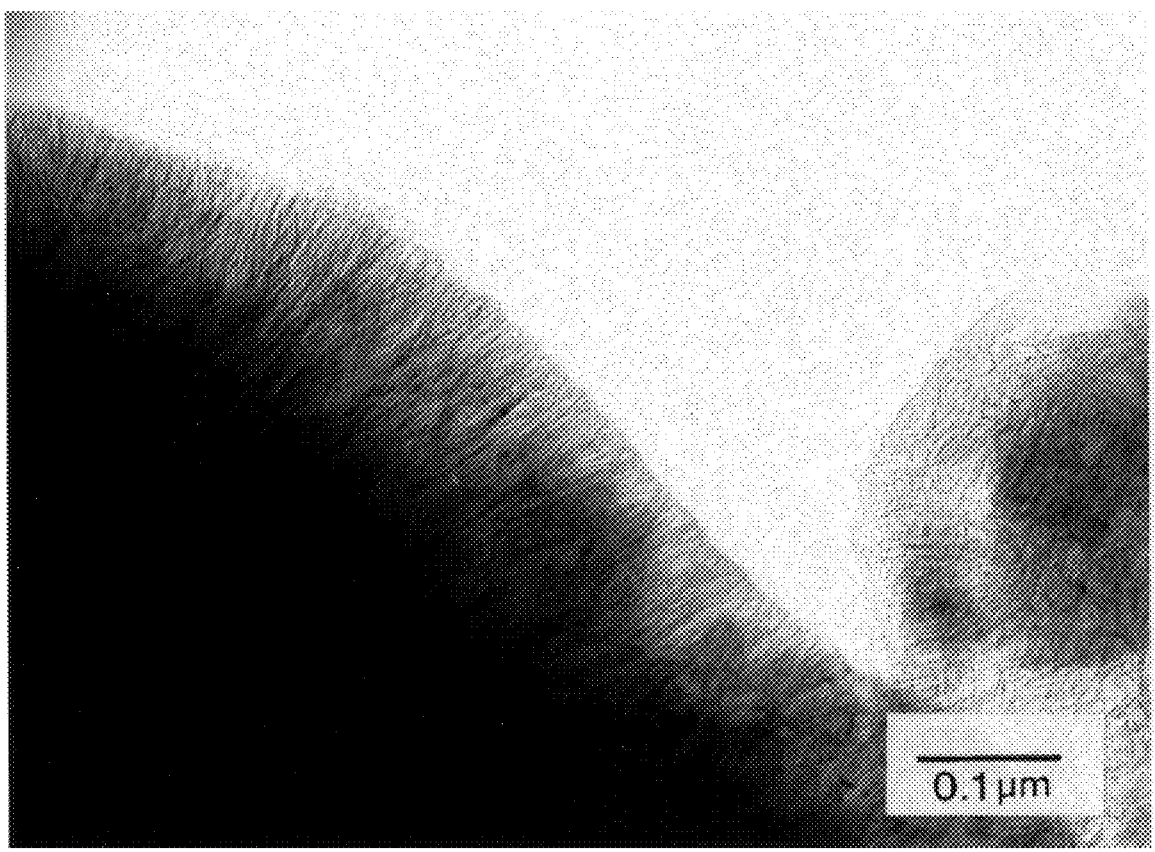
FIG. 7 is a TEM photograph showing the nanotube film formed on the plane 4 of the SiC particle shown in FIG. 2.

FIGS. 4 through 7 show the planes 1 through 4 of the particle shown in FIG. 2 respectively on an enlarged scale. It is apparent that a nanotube film that is composed of carbon nanotubes having a substantially equal length and oriented substantially parallel to the thickness direction of the film is formed on each of the planes. As shown in FIG. 4, the plane 1 exhibits a particularly good orientation of the carbon nanotubes.

Figure 8:
FIG. 8 is a TEM photograph showing the crystal structure in the vicinity of the surface of the SiC particle when a sample shown in FIG. 2 has been further heated.
Figure 9:
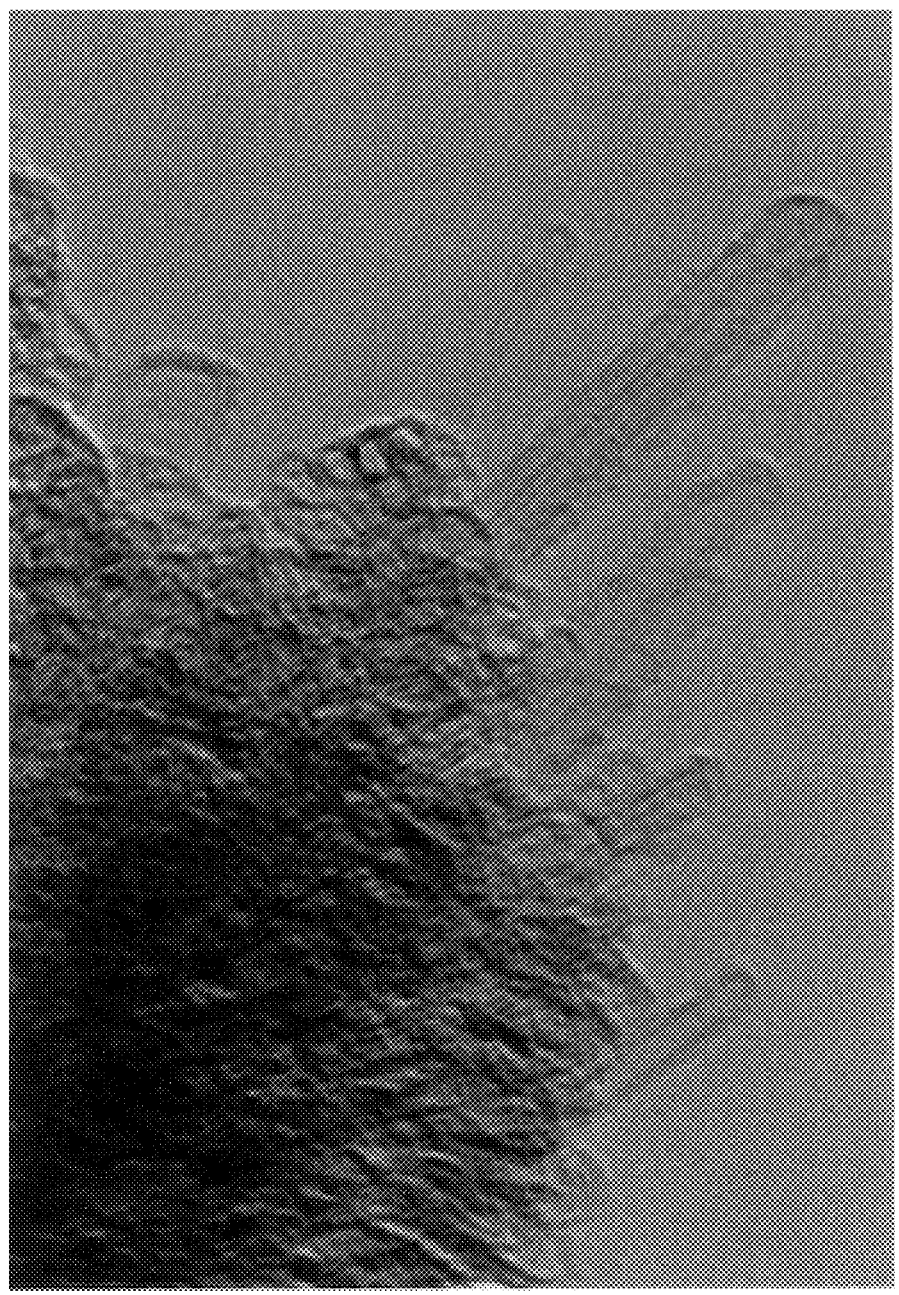
FIG. 9 is a TEM photograph showing the crystal structure in the vicinity of the surface of the SiC particle when the sample shown in FIG. 2 has been further heated.
Figure 10:
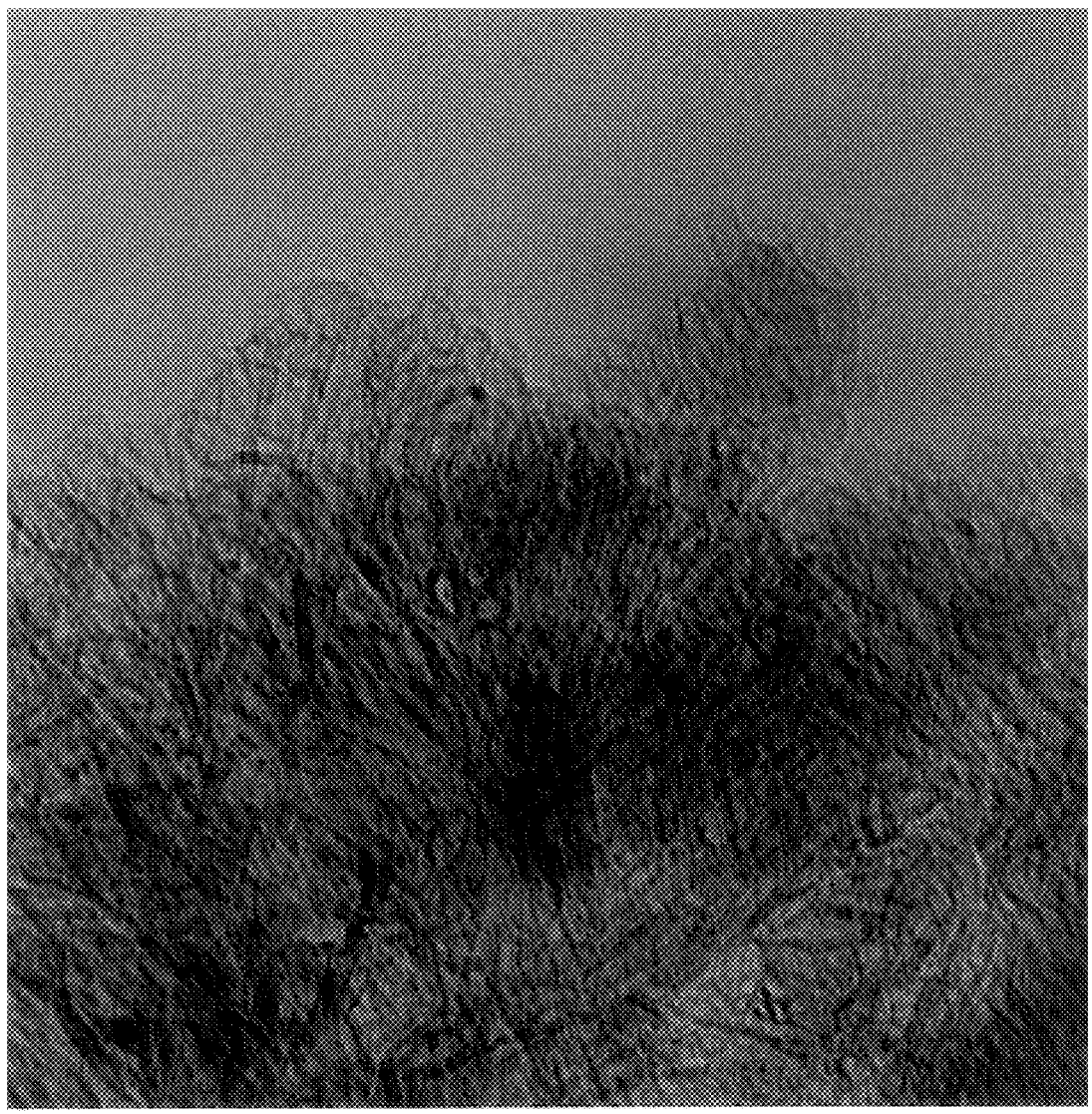
FIG. 10 is a TEM photograph showing the crystal structure in the vicinity of the surface of the SiC particle when the sample shown in FIG. 2 has been further heated.
Figure 11A:
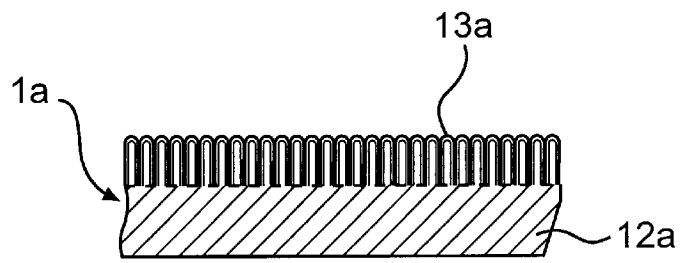
FIGS. 11(a) through 11(c) are cross-sectional model views showing an example of a structure equipped with the nanotube film of the present invention.
Figure 11B:
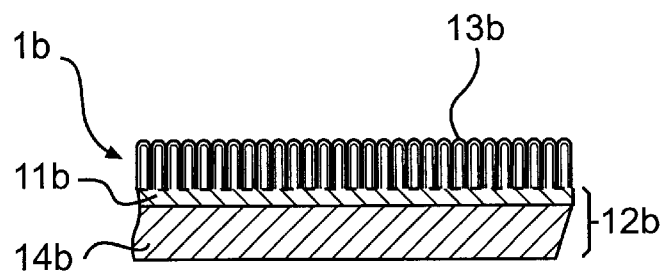
Figure 11C:
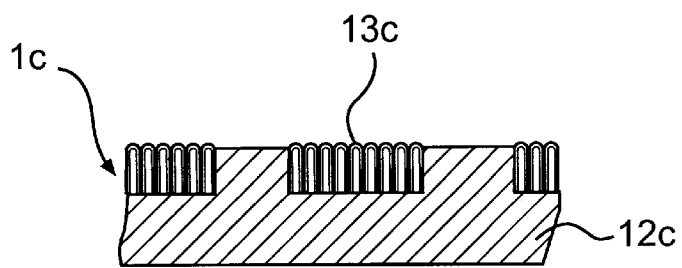

FIGS. 8 through 10 show the aforementioned sample further heated to 1600° C. at a degree of vacuum of $10^{-7}$ Torr after being heated to 1400° C. under the aforementioned conditions. As the sample rose in temperature, it was observed that the carbon nanotubes cannibalize each other and some of them grew further. It is evident from FIGS. 8 through 10 that the thus-grown tubes have a hollow structure with its end closed.

In FIGS. 9 and 10, the entire SiC particle has been changed into carbon nanotubes due to the high temperature. It is considered that the carbons disorderly arranged within the particle have served as a feed source to promote nano-tubulation.

In each of FIGS. 2 through 10, the portion irradiated with the YAG laser beam for heating purposes is observed. However, the generation of carbon nanotubes was observed on the sample heated through heat conduction also at a location out of the irradiation range of the laser. Accordingly, even in the case where the sample is heated to a predetermined temperature using heating means other than irradiation with a laser beam, it is considered that carbon nanotubes will be generated.

Under an observation during a heating process, the sample is irradiated with electron beams. However, since carbon nanotubes have been formed on another portion that was observed after completion of the heating process, it is concluded that the generation of carbon nanotubes does not necessitate irradiation with electron beams.

EXAMPLE 2

The present example 2 is an example in which a heating furnace is used as heating means.

Figure 12:
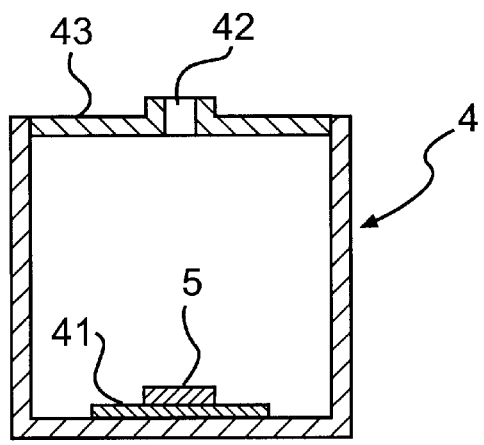
FIG. 12 is a cross-sectional view showing a sample case used in heating the sample in Example 2.
Figure 13:
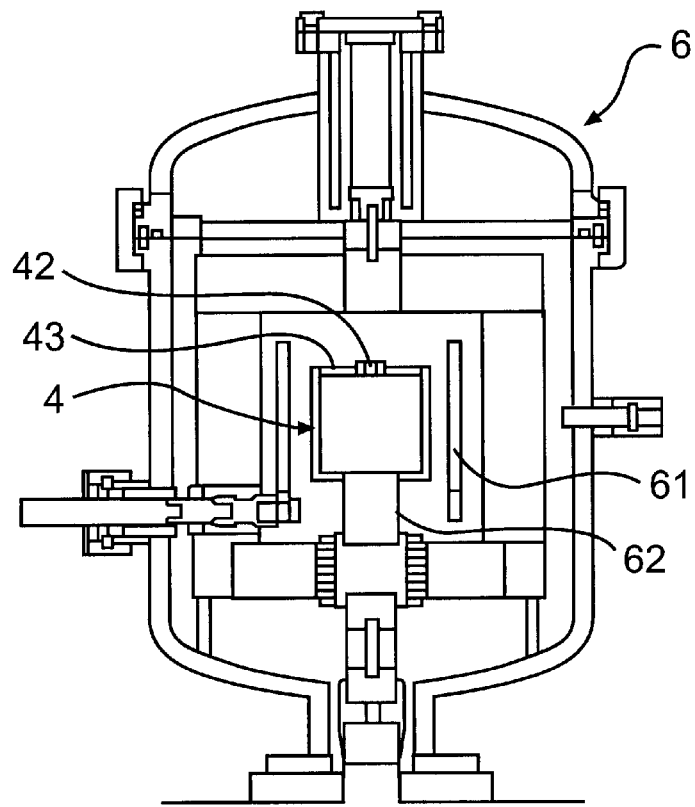
FIG. 13 is an explanatory view schematically showing a carbon heater used in heating the sample in Example 2.

An α-SiC single crystal wafer (in the shape of a flat plate having a dimension of 5×5×0.4 mm) was used as a sample. As shown in FIG. 12, a carbon plate 41 of high purity was laid on a bottom of a cover-attached carbon case 4 serving as a case for the sample (having a dimension of φ130×130 mm), and the aforementioned wafer 5 was horizontally set thereon with its mirror surface ((0001) plane) facing upwards. Then, the cover 43 having an exhaust hole 42 of φ5 mm in a central portion thereof was closed. These were accommodated in a carbon heater 6 shown in FIG. 13 and heated under the following conditions. It is to be noted in FIG. 13 that reference numerals 61 and 62 denote an exothermic body and a bench for the sample case respectively.

[heating conditions]

vacuum≈$1×10^{-4}$ Torr heating furnace; a carbon heater manufactured by Fuji Electric Wave Industry Inc. and named "high multi-10000 furnace"

type of exhaustion; an oil diffusion pump and a rotary pump measurement of temperature; thermo-couples are used below 1200° C. and a pyrometer attached to the heating furnace is used at 1200° C. or higher.

heat-up rate; the temperature first rises from a room temperature to 1200° C. in an hour and reaches 1700° C. in the next thirty minutes. Then, the sample is maintained at 1700° C. for thirty minutes.

cooling-down rate; the temperature falls to 1000° C. in thirty minutes and the sample is subjected to furnace cooling.

Figure 14A:
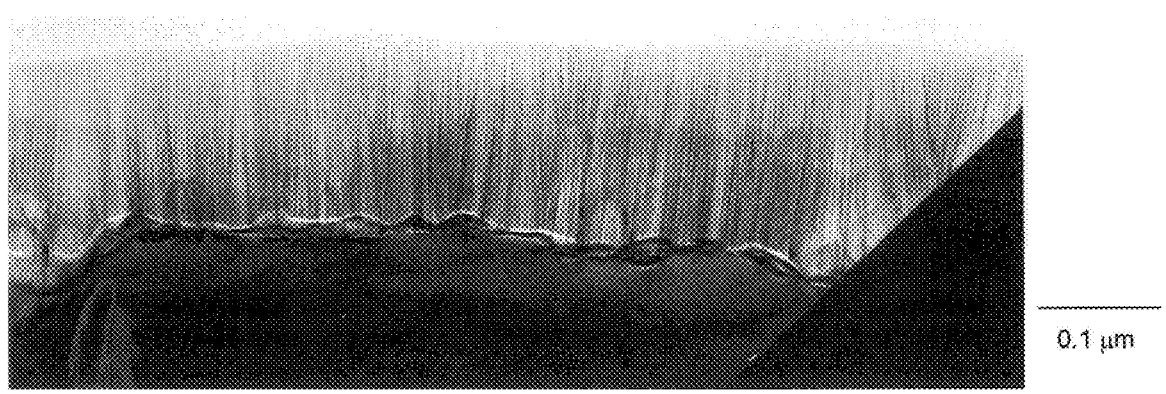
FIG. 14(a) is a TEM photograph showing a cross-section of the structure equipped with the nanotube film manufactured according to Example 2.

FIG. 14(a) shows an observed image of a TEM cross-section of the sample that has been obtained by means of dimpling and ion thinning. It is to be noted herein that a black portion in the lower part is a SiC crystal. There is a contrast observed among streaks having a uniform thickness of 0.15 $\mu$m and extending perpendicular to the surface of the SiC crystal. These streaks are formed of a carbon layer that has been left as a result of decomposition and removal of silicon atoms due to the heating process of SiC. This fact was also confirmed by an elemental analysis, which proved that the streaks are essentially made of carbon.

Figure 14B:
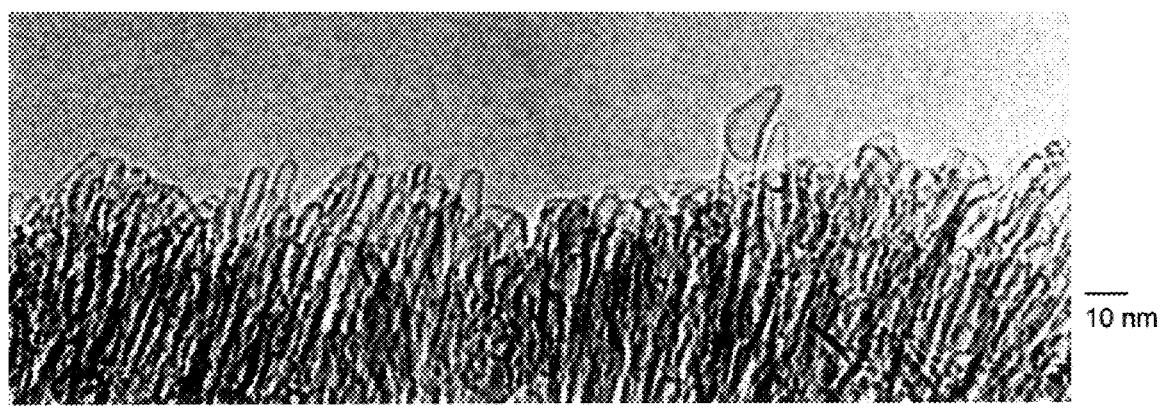
FIG. 14(b) is a TEM photograph showing the tips of carbon nanotubes shown in FIG. 14(a) on an enlarged scale.

FIG. 14(b) shows an enlarged image of the tips of the carbon nanotubes shown in FIG. 14(a). This image has revealed that the densely arranged carbon nanotubes with a cross-sectional diameter of 2~5 nm form a orientation film.

As shown in FIG. 14(a), the carbon nanotubes are linear and substantially of an equal length. It has also been revealed that the length of the carbon nanotubes (the thickness of the nanotube film) can be controlled easily by adjusting temperature, time and degree of vacuum. For example, in the case where the sample was heated under the condition that "the temperature rises from 1200° C. to 1500° in thirty minutes" instead of the condition that "the temperature rises from 1200° C. to 1700° in thirty minutes" while all the other heating conditions remained unchanged, the length of the carbon nanotubes turned out to be 50 nm (0.05 $\mu$m).

Figure 15:
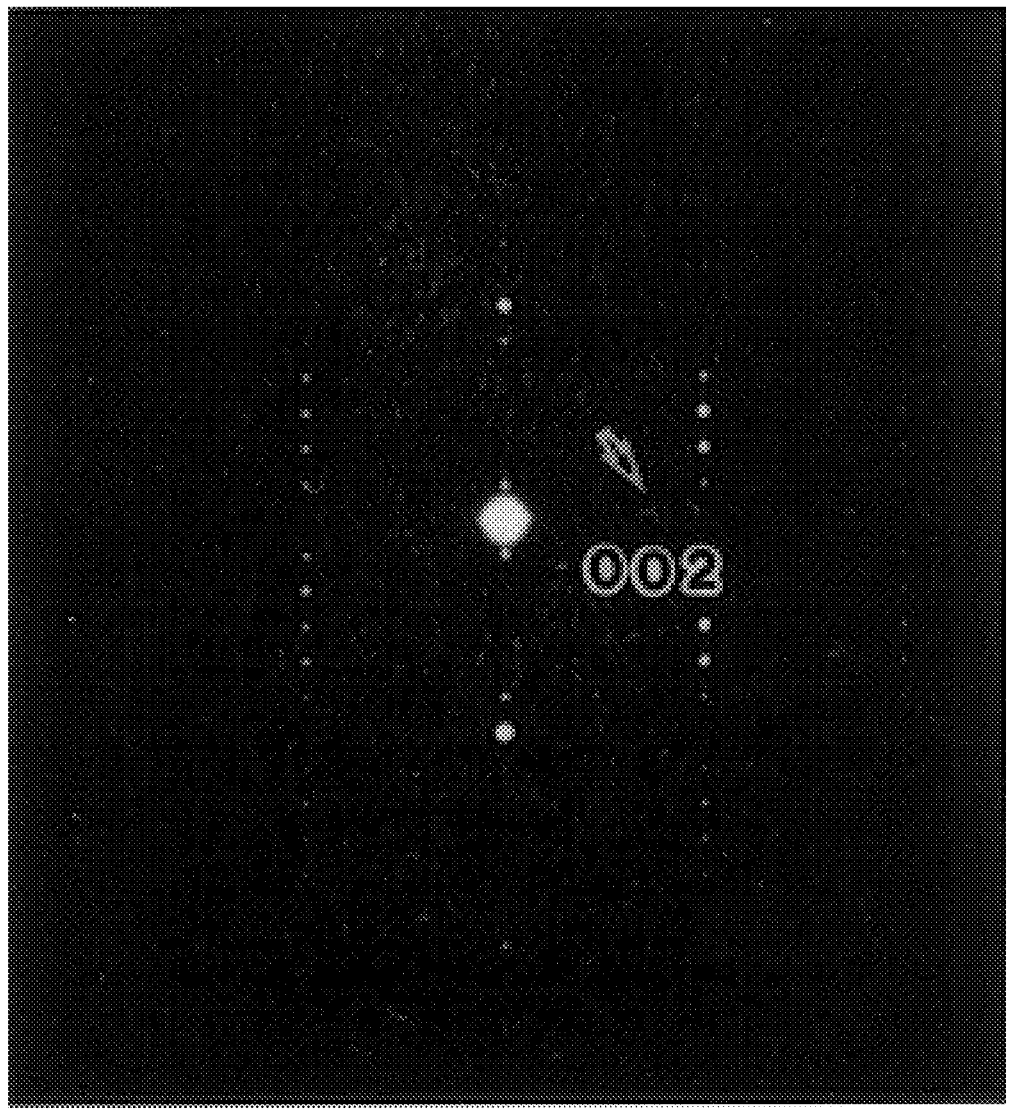
FIG. 15 is a photograph showing an electron diffraction pattern including the SiC crystal and the carbon nanotubes of the structure equipped with the nanotube film manufactured according to Example 2.

FIG. 15 shows an electron beam diffraction pattern including the SiC crystal and the carbon nanotubes of the aforementioned sample. The diffraction pattern indicates that the direction of incidence of the electron beam is parallel to the direction [110] of SiC and the direction of reflection of 002 of graphite is completely perpendicular to the direction [001] of SiC. The reflection of 002 of graphite is sharp and indicates that the carbon nanotubes exhibit a very high degree of orientation. It has been measured using this diffraction pattern that the lattice constant of the graphite constituting the carbon nanotubes is 0.344 nm.

The present invention is not limited to the aforementioned concrete examples, and these examples are susceptible of various modifications within the scope of the present invention in accordance with the purpose and usage thereof.

What is claimed is:

1. A method of manufacturing carbon nanotubes, wherein silicon atoms are removed from a SiC crystal by heating said SiC crystal in a vacuum at a temperature ranging from 1200 to 2200° C.

2. The method according to claim 1, wherein said vacuum ranges from $10^{-4}$ to $10^{-10}$ Torr.

3. A method of manufacturing a carbon nanotube film that is composed of a plurality of carbon nanotubes oriented so that the central axes of the nanotubes extend substantially parallel to a thickness direction of the film, wherein silicon atoms are removed from a SiC crystal by heating said SiC crystal in a vacuum at a temperature ranging from 1400 to 2000° C.

4. The method according to claim 3, wherein said vacuum ranges from $10^{-5}$ to $10^{-9}$ Torr.

\* \* \* \* \*